United States Patent
Kuwabara

(10) Patent No.: US 9,084,192 B2
(45) Date of Patent: Jul. 14, 2015

(54) SYNCHRONIZATION DEVICE AND SYNCHRONIZATION METHOD

(75) Inventor: Toshihide Kuwabara, Tokyo (JP)

(73) Assignee: NEC CORPORATION, Tokyo (JP)

( * ) Notice: Subject to any disclaimer, the term of this patent is extended or adjusted under 35 U.S.C. 154(b) by 42 days.

(21) Appl. No.: 14/007,055

(22) PCT Filed: Nov. 8, 2011

(86) PCT No.: PCT/JP2011/075655
§ 371 (c)(1),
(2), (4) Date: Sep. 24, 2013

(87) PCT Pub. No.: WO2012/132089
PCT Pub. Date: Oct. 4, 2012

(65) Prior Publication Data
US 2014/0016543 A1    Jan. 16, 2014

(30) Foreign Application Priority Data
Mar. 25, 2011   (JP) .................. 2011-067325

(51) Int. Cl.
 H04W 56/00  (2009.01)
 G04R 40/00  (2013.01)
 H03L 7/14   (2006.01)
 H04J 3/06   (2006.01)

(52) U.S. Cl.
CPC .......... H04W 56/0015 (2013.01); G04R 40/00 (2013.01); H03L 7/146 (2013.01); H04J 3/0688 (2013.01)

(58) Field of Classification Search
CPC .. H04W 56/0015; G04R 40/00; H04J 3/0688; H03L 7/146
See application file for complete search history.

(56) References Cited

U.S. PATENT DOCUMENTS

| | | | | |
|---|---|---|---|---|
| 6,081,163 | A * | 6/2000 | Ujiie et al. | 331/2 |
| 6,711,230 | B1 * | 3/2004 | Nicholls et al. | 375/376 |
| 7,015,762 | B1 * | 3/2006 | Nicholls et al. | 331/10 |
| 7,064,619 | B1 * | 6/2006 | Meyer et al. | 331/44 |
| 7,266,140 | B1 * | 9/2007 | Hasegawa et al. | 375/130 |
| 7,424,069 | B1 * | 9/2008 | Nicholls et al. | 375/339 |
| 7,606,541 | B1 * | 10/2009 | Nicholls et al. | 455/147 |
| 2002/0057544 | A1 * | 5/2002 | Sugiura et al. | 361/68 |
| 2002/0084933 | A1 * | 7/2002 | Krasner | 342/357.01 |
| 2004/0198387 | A1 * | 10/2004 | Tsuji et al. | 455/456.1 |
| 2005/0015198 | A1 * | 1/2005 | Kee et al. | 701/207 |
| 2009/0225743 | A1 * | 9/2009 | Nicholls et al. | 370/350 |
| 2009/0278616 | A1 * | 11/2009 | Nicholls et al. | 331/44 |
| 2010/0099434 | A1 * | 4/2010 | Murayama et al. | 455/456.1 |
| 2011/0085540 | A1 * | 4/2011 | Kuwabara | 370/350 |
| 2011/0103337 | A1 * | 5/2011 | Bryant et al. | 370/329 |

FOREIGN PATENT DOCUMENTS

JP   2000-332678 A   11/2000
JP   2003-087182 A    3/2003

(Continued)

Primary Examiner — Clemence Han
(74) Attorney, Agent, or Firm — Sughrue Mion, PLLC

(57) ABSTRACT

A synchronization device has a normal-signal generator, a reference-signal generator, and a phase difference detector. The normal-signal generator generates a normal signal whose timing is synchronized with a time signal from a satellite. The reference-signal generator generates a reference signal whose timing is synchronized with a received signal. The phase difference detector detects the phase difference between the reference signal and the normal signal. The normal-signal generator then controls the normal signal on the basis of the phase difference when the time signal cannot be obtained.

7 Claims, 3 Drawing Sheets

(56) References Cited

FOREIGN PATENT DOCUMENTS

| JP | 2006-217359 A | 8/2006 |
| JP | 2009-222486 A | 10/2009 |
| JP | 2010-141489 A | 6/2010 |
| JP | 2011-146858 A | 7/2011 |

* cited by examiner

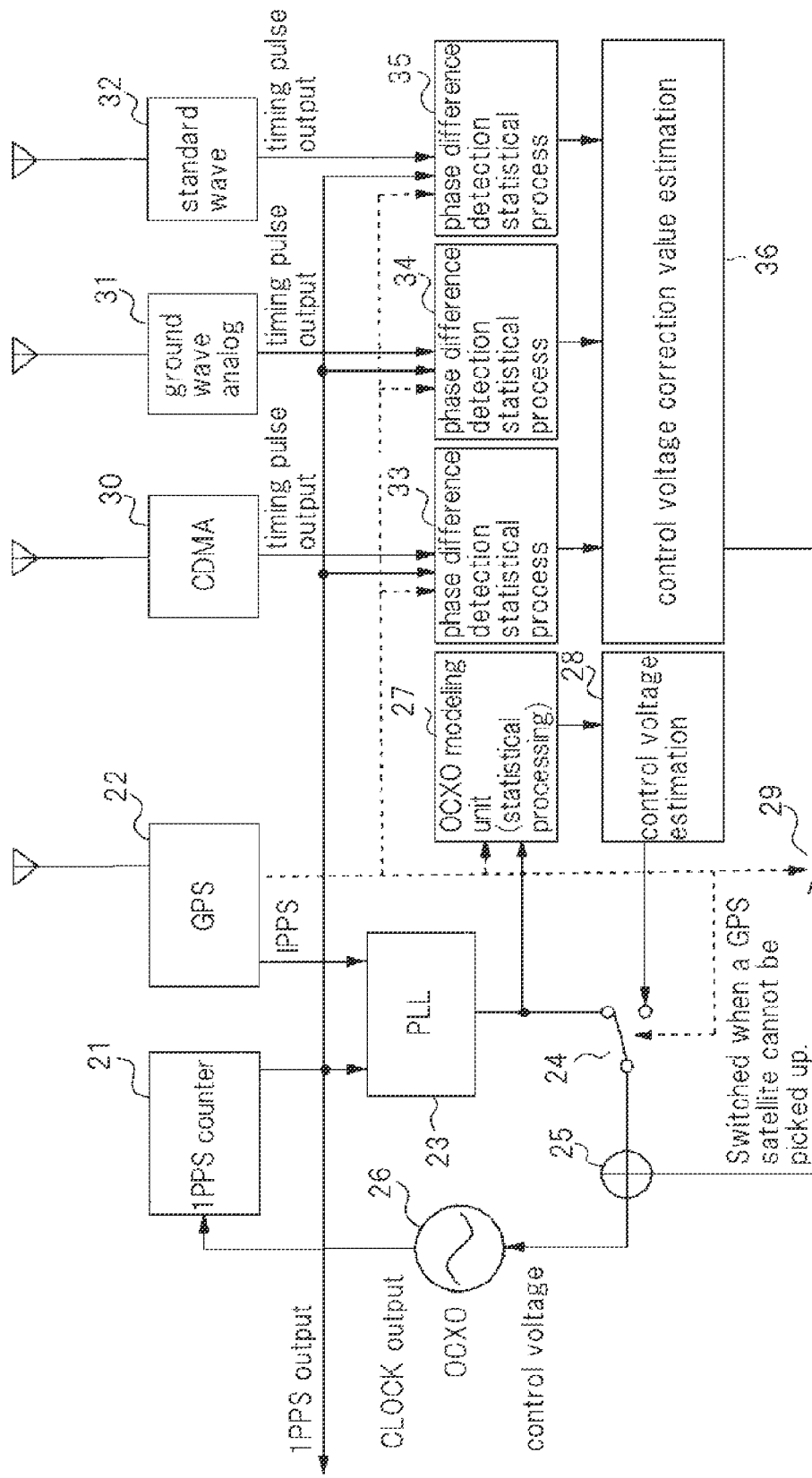

SYNCHRONIZATION DEVICE AND SYNCHRONIZATION METHOD

CROSS REFERENCE TO RELATED APPLICATIONS

This application is a National Stage of International Application No. PCT/JP2011/075655 filed Nov. 8, 2011, claiming priority based on Japanese Patent Application No. 2011-067325 filed Mar. 25, 2011, the contents of all of which are incorporated herein by reference in their entirety.

TECHNICAL FIELD

The present invention relates to a synchronization device that generates a normal signal whose timing that is synchronized with a time signal from the outside.

BACKGROUND ART

In a wireless communication system such as CDMA (Code Division Multiple Access) or WiMAX (Worldwide Interoperability for Microwave Access), the realization of time synchronization is sought between base stations with error no greater than microseconds. As a result, time acquisition is carried out using GPS (Global Positioning System) in devices that make up this type of wireless communication system (See Patent Document 1).

However, in devices that carry out time acquisition using GPS, various factors hinder the acquisition of accurate time. For example, breakdowns due to causes such as the deterioration of a device over time or due to damage to an antenna due to lightning. A state in which a GPS signal cannot be received due to this type of damage may continue for a short time or for a long time period.

For example, in a state in which the GPS satellite cannot be picked up, a synchronization device having a configuration in which an outside oscillator is controlled by a Phase Locked Loop (PLL) circuit that takes as input a timing signal that is based on a GPS time signal maintains time accuracy by relying on only the degree of the frequency stability of the outside oscillator. In a state in which a highly stable device such as a double-oven OCXO (Oven-Controlled Crystal Oscillator) is selected as the outside oscillator, the frequency stability is on the order of $10^{-10}$. With this level of stability, a shift of approximately 4.3 μsec occurs over 24 hours. In actuality, apart from the stability of the oscillator itself, the stability of a nearby power supply and the control voltage also affect the stability and the divergence in time may therefore be an even greater value.

LITERATURE OF THE PRIOR ART

Patent Documents

Patent Document 1: Japanese Unexamined Patent Application Publication No. 2009-222486

SUMMARY OF THE INVENTION

Problem to be Solved by the Invention

In a wireless communication system that requires highly accurate time synchronization as described hereinabove, means is sought for enabling the desired time synchronization accuracy to be maintained even in a state in which a time signal cannot be received from a satellite.

It is an object of the present invention to provide a technique for preventing a drop in the accuracy of time synchronization when the time signal from a satellite cannot be obtained.

Means for Solving the Problem

For the purpose of achieving the above-described object, the synchronization device of the present invention includes:
a normal-signal generator that generates a normal signal whose timing is synchronized with a time signal from a satellite;
a reference-signal generator that generates a reference signal whose timing is synchronized with a received signal; and
a phase difference detector that detects the phase difference between the reference signal and the normal signal;
wherein the normal-signal generator, when the time signal cannot be obtained, controls the normal signal based on the phase difference.

The synchronization method of the present invention includes:
generating a normal signal whose timing is synchronized with a time signal from a satellite;
generating a reference signal whose timing is synchronized with the received signal;
detecting the phase difference between the reference signal and the normal signal; and
when the time signal cannot be obtained, controlling the normal signal based on the phase difference.

Effect of the Invention

According to the present invention, a technology is provided to prevent a drop in the accuracy of time synchronization when a time signal cannot be obtained from a satellite.

BRIEF DESCRIPTION OF THE DRAWINGS

FIG. 3 is a block diagram showing the configuration of synchronization device 10 of an actual example.

MODE FOR CARRYING OUT THE INVENTION

A mode for carrying out the present invention is next described in detail with reference to the accompanying figures.

Figure 1:
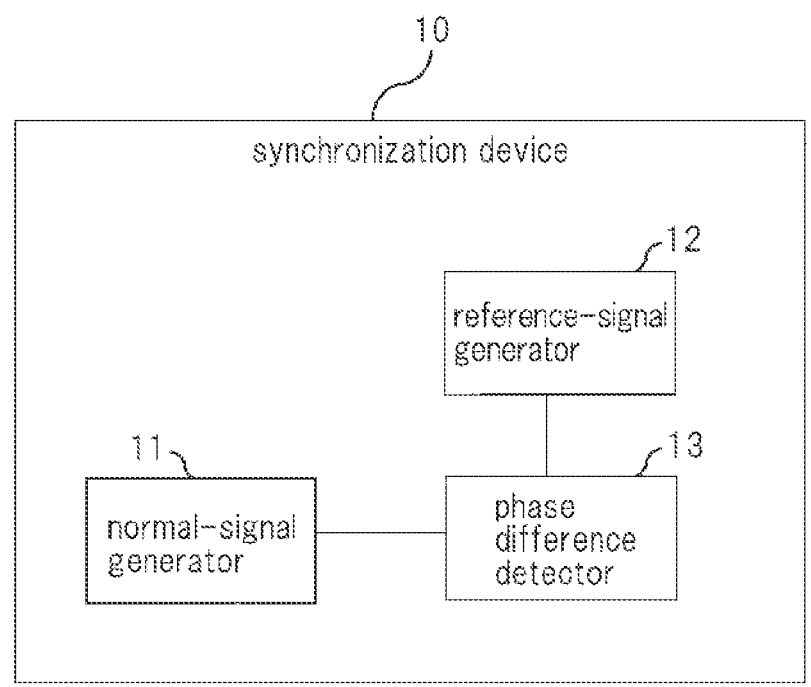
FIG. 1 is a block diagram showing the configuration of the synchronization device of the exemplary embodiment.

FIG. 1 is a block diagram showing the configuration of the synchronization device of the present exemplary embodiment. This figure shows an exemplary embodiment having the basic construction of the present invention. Referring to FIG. 1, synchronization device 10 includes normal-signal generator 11, reference-signal generator 12, and phase difference detector 13.

Normal-signal generator 11 generates a normal signal whose timing is synchronized with a time signal received from a GPS satellite. More specifically, normal-signal generator 11 analyzes a signal from a GPS satellite to acquire time information and generates a normal signal of 1PPS (Pulses per Second) that is synchronized with this time.

In addition, normal-signal generator 11 controls the normal signal based on the phase difference between a reference signal and the normal signal when the time signal from the GPS satellite cannot be received. The phase difference is detected in phase difference detector 13. For example, based on the phase difference that is detected in phase difference detector 13, normal-signal generator 11 should estimate a correction value of the control voltage for a voltage-controlled oscillator that is used in the generation of the normal signal and add this correction value to the control voltage to control the voltage-controlled oscillator. Normal-signal generator 11 should determine the correction value of the control voltage such that the phase difference that is detected at phase difference detector 13 matches the phase difference that was measured and that was subjected to statistical processing when the time signal could be received from the GPS satellite.

Reference-signal generator 12 receives another signal that is not the signal from the GPS satellite and generates a reference signal whose timing is synchronized with the received signal.

For example, reference-signal generator 12 may receive a signal from a base station of a wireless communication system such as CDMA or WiMAX and generate a reference signal that is synchronized with the received signal. Alternatively, reference-signal generator 12 may receive a broadcast signal that is issued from a broadcast station such as a television station and then generate a reference signal that is synchronized with this received signal. Still further, reference-signal generator 12 may receive a standard wave for radio clocks (JJY) and generate a reference signal that is synchronized with this received signal.

Phase difference detector 13 detects the phase difference between the reference signal that is generated by reference-signal generator 12 and the normal signal that is generated by normal-signal generator 11. Normal-signal generator 11 is able to carry out the generation of a normal signal normally if a time signal can be received normally from a GPS satellite. Reference-signal generator 12 is also able to carry out the generation of a reference signal normally if it can receive the relevant received signal normally. Phase difference detector 13 continuously measures the phase difference between the reference signal and normal signal when the generation of the reference signal by reference-signal generator 12 and the generation of normal signal by normal-signal generator 11 are both being carried out normally. Phase difference detector 13 then subjects the measured phase difference to statistical processing such as averaging.

The phase difference that is detected at phase difference detector 13 is used in the generation of a normal signal when normal-signal generator 11 is unable to receive the time signal from a GPS satellite normally.

According to the present exemplary embodiment, a drop in accuracy of time synchronization can be prevented when the time signal from a GPS satellite cannot be obtained in a synchronization device.

Figure 2:
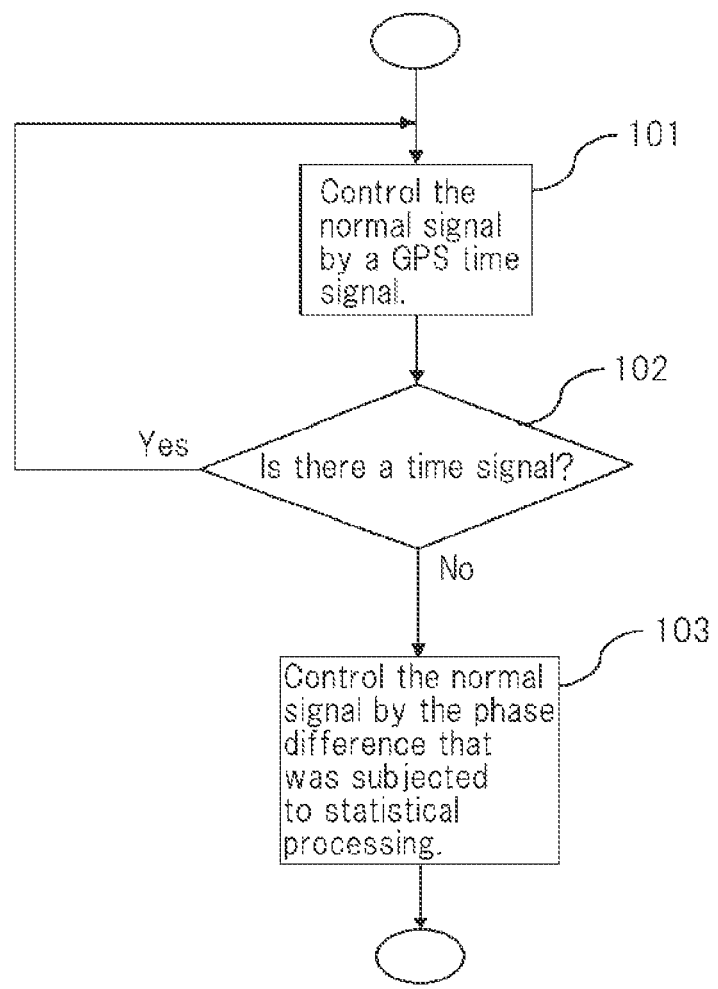
FIG. 2 is a flow chart showing the basic operations of synchronization device 10 of the present exemplary embodiment.

FIG. 2 is a flow chart showing the basic operation of synchronization device 10 of the present exemplary embodiment. Referring to FIG. 2, during normal operation, synchronization device 10 generates a normal signal whose timing is synchronized with a time signal from a GPS satellite (Step 101). During this time, synchronization device 10 also generates a reference signal whose timing is synchronized with another received signal that is not from the GPS satellite and detects the phase difference between the reference signal and the normal signal.

Synchronization device 10 then monitors whether the time signal from the GPS satellite is being received or not (Step 102). If the time signal from the GPS satellite is being received, synchronization device 10 returns to Step 101 and repeats the process. On the other hand, when the time signal is not being received, synchronization device 10 controls the normal signal based on the phase difference that was detected.

In the present exemplary embodiment, when generating a normal signal whose timing is synchronized with the time signal from the GPS satellite, normal-signal generator 11 may statistically process and hold a control signal that is used to control this normal signal, and in a state in which the time signal is not being acquired, may control the normal signal based on the control signal that was saved.

Normal-signal generator 11 may further correct the control signal based on the phase difference that is detected by phase difference detector 13 if the continuous time interval of a state in which the time signal cannot be obtained surpasses a predetermined threshold value time interval.

Specific Example

A specific example of synchronization device 10 of the present exemplary embodiment is next described.

FIG. 3 is a block diagram showing the configuration of synchronization device 10 of the present specific example.

Referring to FIG. 3, synchronization device 10 includes: 1PPS counter 21, GPS receiver 22, PLL unit 23, switch 24, adder 25, outside oscillator (OCXO) 26, OCXO modeling unit 27, control voltage estimation unit 28, switch 29, CDMA receiver 30, ground wave analog broadcast receiver 31, standard wave receiver 32, phase difference detection statistical processors 33-35, and control voltage correction value estimation unit 36.

GPS receiver 22 receives and analyzes the signal from a GPS satellite and acquires the time. GPS receiver 22 then generates and supplies as output a 1PPS signal that is synchronized with this time. Apart from the function of reporting the current time, GPS receiver 22 also has the function of, when the GPS satellite cannot be picked up, reporting that the GPS satellite cannot be picked up. When the GPS satellite cannot be picked up, GPS receiver 22 becomes unable to supply 1PPS at an accurate timing.

1PPS counter 21 generates a 1PPS signal by frequency-dividing the output of outside oscillator 26.

PLL unit 23 compares the phases of the 1PPS signal from GPS receiver 22 and the 1PPS signal obtained by frequency-dividing the output of outside oscillator 26. PLL unit 23 averages the phase difference of these signals by statistical processing and generates a voltage signal according to the averaged phase difference. PLL unit 23 then provides the voltage signal to outside oscillator 26 as the control voltage by way of switch 24 and adder 25.

As a result, outside oscillator 26 enters a PLL-controlled state with the 1PPS signal based on the time signal from the GPS satellite as the normal signal.

The control voltage of outside oscillator 26, when PLL control is operating normally, is monitored by OCXO modeling unit 27 that is made up by a CPU. and OCXO modeling unit 27 implements the statistical process of averaging for the control voltage. OCXO modeling unit 27 records the result of the statistical process of averaging as the estimated value of the control voltage in the memory of control voltage estimation unit 28.

The above-described PLL control can further achieve, by settings input from the outside, maintaining a temporarily halted state by switching switch 24 from the PLL unit 23-side to the control voltage estimation unit 28-side. When it is reported from GPS receiver 22 that the GPS satellite can no longer be picked up, the connection destination of switch 24 is switched from PLL unit 23 to control voltage estimation unit 28, and PLL control is temporarily halted. The value that is recorded in control voltage estimation unit 28 is then applied as the control voltage to outside oscillator 26.

CDMA receiver 30 holds a CDMA reception circuit, analyzes the received signal from a CDMA base station to detect a synchronizing signal, and generates and supplies a synchronization pulse based on this detection result.

In addition, ground wave analog broadcast receiver 31 holds a reception circuit of ground wave analog broadcasts, detects a horizontal synchronizing signal from the signal of the ground wave analog broadcast that is received, and generates and supplies a synchronization pulse based on the detection result.

Standard wave receiver 32 further holds a standard wave reception circuit of JJY, analyzes the received signal of the standard wave to detect a synchronizing signal, and generates and supplies a synchronization pulse based on the detection results.

Synchronization device 10 does not have to be equipped with all of the following components, CDMA receiver 30, ground wave analog broadcast receiver 31, and standard wave receiver 32, but may be a construction equipped with one or a plurality of these components.

In addition, synchronization device 10 may be equipped with a WiMAX receiver (not shown). In this case, the WiMAX receiver has a WiMAX signal reception circuit, analyzes the received signal to detect a synchronizing signal, and generates and supplies a synchronization pulse based on the detection result.

The correction reference signal (a synchronization pulse) that is supplied from CDMA receiver 30, ground wave analog broadcast receiver 31, standard wave receiver 32, and the WiMAX receiver is a pulse with a one-second interval. This correction reference signal need not show the absolute time that coincides with the standard time. Further, the correction reference signal need not include information of the current time.

The operation of synchronization device 10 of the present specific example including the operation of phase difference detection statistical processors 33-35 and control voltage correction value estimation unit 36 is next described.

During Normal Operation (a state in which the necessary and sufficient number of GPS satellites can be picked up):

During normal operation, outside oscillator 26, under PLL control, synchronizes with a 1PPS signal based on a signal from a GPS satellite, whereby accurate time information and timing pulses are obtained. Highly accurate synchronization between, for example, wireless base stations is realized based on this information OCXO modeling unit 27 monitors the control voltage of outside oscillator 26 and averages the values. OCXO modeling unit 27 records the averaged control voltage in the memory of control voltage estimation unit 28.

In addition, phase difference detection statistical processors 33-35 that are made up by a CPU compare the phase of a correction reference signal from a correction reference signal generation circuit such as CDMA receiver 30, ground wave analog broadcast receiver 31, standard wave receiver 32, and a WiMAX receiver with the phase of the 1PPS signal from 1PPS counter 21 that is generated by frequency-dividing the output of outside oscillator 26, average the phase differences, and record the average phase differences in memory. Here, the absolute time is not detected.

During Semi-Normal Operation (a state in which a GPS satellite cannot be picked up temporarily due to, for example, the environment of installation):

During semi-normal operation, switch 24 is switched from the PLL unit 23-side to the control voltage estimation unit 28-side, the PLL operation is temporarily halted, and the value that was recorded in control voltage estimation unit 28 during normal operation is applied as the control voltage to outside oscillator 26, whereby the 1PPS signal having a desired accuracy is continuously supplied without loss of stability of the frequency of outside oscillator 26 as long as the duration of this semi-normal operation is sufficiently short-lived.

During Abnormal Operation (a state in which a GPS satellite cannot be picked up permanently due to, for example, breakdown of the GPS antenna):

When a state in which the GPS satellite cannot be picked up continues for more than a set time interval, the PLL operation is temporarily halted and the control voltage is applied to outside oscillator 26 from control voltage estimation unit 28, as during the above-described semi-normal operation.

At the same time, phase difference detection statistical processors 33-35 compare the phase of correction reference signals from correction reference signal generation circuits with the phase of the 1PPS signal from 1PPS counter 21 that was generated by frequency-dividing the output of outside oscillator 26 and detect the phase difference.

Control voltage correction value estimation unit 36 then supplies a correction value of the control voltage such that the phase difference that was detected in phase difference detection statistical processors 33-35 during abnormal operation coincides with the phase difference that was recorded in memory during normal operation. More specifically, control voltage correction value estimation unit 36 applies correction to the control voltage to outside oscillator 26 such that, if the phase difference that was detected in phase difference detection statistical processors 33-35 during abnormal operation has a statistically significant difference with the phase difference that was recorded in memory during normal operation, this difference is eliminated.

In the comparison of the above-described correction reference signal and the 1PPS signal from 1PPS counter 21, variation will occur due to the types of received signals from the outside that are used in correction.

When a signal from a CDMA base station or a signal from a WiMAX base station is used as the correction signal, time synchronization by means of GPS is also used for these correction signals in the transmission-origin base stations. As a result, the frequencies of the correction reference signal and the 1PPS signal from 1PPS counter 21 coincide. However, because phase differences occur due to factors such as the difference in distance from the base station, a constant fixed phase difference is observed between the reference signal and the 1PPS signal when the correction reference signal and the 1PPS signal from 1PPS counter 21 are compared. Therefore, in this case, the phase difference should be simply averaged over a fixed time interval, and taking the obtained value as a reference, a correction value should be calculated such that the phase difference between the reference signal and the 1PPS signal, which is produced during abnormal operation, equals this reference.

Alternatively, when the horizontal synchronizing signal of a ground wave analog broadcast is used as the correction signal, there is no reason to expect that the signal for correction will be synchronized with the GPS time. When observed over a long time interval, drift occurs between the correction reference signal and the 1PPS signal from 1PPS counter 21.

In this case, the change in phase difference is estimated and the correction value is calculated based on the result of observing the amount of drift in the phase difference over a long time interval such that similar drift occurs during abnormal operation as during normal operation.

When a standard wave (JJY) is used as the correction signal, the accuracy of the signal origin is equivalent to that of GPS. However, problems arise regarding the reliability of the observed value due to influences such as the season, weather, and time zone upon the characteristics of the wave (long-wave) that is used in the standard wave and due to the large possibility that unnecessary waves may be erroneously detected. For this reason, subjecting the results of observation during normal operation to a median-average statistical process not only eliminates influences such as erroneous detection but also records the fluctuation between day and night and even longer-term time changes. During abnormal operation, the median-average process is implemented for the observation results of more than the fixed time interval of the correction signal, and after further correction of time changes such as fluctuation, the phases of this correction signal and the 1PPS signal are compared. The control voltage of outside oscillator 26 is then corrected based on the obtained phase difference.

In the present specific example, the accuracy of timing pulses can be continuously maintained within a fixed range based on the correlation with another reference signal even in a state in which a GPS satellite cannot be picked up. In some cases, accurate time cannot be obtained from the reference signal itself due to the distance from the signal origin or the reception environment. However, accurate time information is still supplied because the reference signal that is used to calculate correction data in a state in which pickup of the GPS satellite becomes impossible is based on information of the phase difference in the state in which pickup of the GPS satellite was possible. Thus, when an unexpected state occurs such as the breakdown of a GPS antenna, highly accurate time synchronization can be maintained and the wireless communication system can be operated without shut-down even when replacement of the apparatus takes a considerably long time.

Although exemplary embodiments of the present invention have been described hereinabove, the present invention is not limited to only these exemplary embodiments, and may be modified within the scope of the technical concept of the present invention and, for example, these exemplary embodiments can be used in combination or portions of the configuration. The configuration and details of the invention of the present application are open to various modifications within the scope of the invention of the present application that will be clear to any one of ordinary skill in the art.

This application claims the benefits of priority based on Japanese Patent Application No. 2011-067325 for which application was submitted on Mar. 25, 2011 and incorporates by citation all of the disclosures of that application.

EXPLANATION OF REFERENCE NUMBERS 10 synchronization device
11 normal-signal generator
12 reference-signal generator
13 phase difference detector
21 PPS counter
22 GPS receiver
23 PLL unit
24 switch
25 adder
26 outside oscillator
27 OCXO modeling unit
28 control voltage estimation unit
29 switch
30 CDMA receiver
31 ground wave analog broadcast receiver
32 standard wave receiver
33-35 phase difference detection statistical processors
36 control voltage correction value estimation unit

What is claimed is:

1. A synchronization device comprising:
   a normal-signal generator that generates a normal signal whose timing is synchronized with a time signal from a satellite;
   a reference-signal generator that generates a reference signal whose timing is synchronized with a received signal; and
   a phase difference detector that detects a phase difference between said reference signal and said normal signal;
   wherein said normal-signal generator, when said time signal cannot be obtained, controls said normal signal based on said phase difference.

2. The synchronization device as set forth in claim 1, wherein:
   said phase difference detector detects said phase difference in advance by statistically processing a phase of said reference signal and a phase of said normal signal while said time signal is being obtained; and
   when said time signal cannot be obtained, said normal-signal generator controls said normal signal such that the phase difference between said reference signal and said normal signal matches said phase difference that was detected in advance by said phase difference detector.

3. The synchronization device as set forth in claim 1, wherein said normal-signal generator: carries out statistical processing of a control signal used in control of said normal signal while said time signal is being obtained and holds a result of the statistical processing of the control signal; when in a state in which said time signal cannot be obtained, controls said normal signal based on said control signal that was held; and when the state in which said time signal cannot be obtained surpasses a predetermined threshold-value time interval, corrects said control signal based on said phase difference that was detected in said phase difference detector.

4. The synchronization device as set forth in claim 1, wherein said received signal is any one of a signal transmitted from a wireless communication base station, a signal for broadcast, and a signal of a standard wave, a combination of any of these signals, or all of these signals.

5. The synchronization device as set forth in claim 1, wherein said time signal is a GPS signal.

6. A synchronization method comprising:
   generating a normal signal whose timing is synchronized with a time signal from a satellite;
   generating a reference signal whose timing is synchronized with a received signal;
   detecting a phase difference between said reference signal and said normal signal; and
   when said time signal cannot be obtained, controlling said normal signal based on said phase difference.

7. The synchronization method as set forth in claim 6, further comprising:
   continuously measuring the phase difference between said reference signal and said normal signal and statistically processing the measurement result; and
   when said time signal cannot be obtained, controlling said normal signal such that the phase difference that is measured matches the phase difference when said time signal was being obtained.

* * * * *